United States Patent
Motz et al.

(10) Patent No.: US 7,158,063 B2
(45) Date of Patent: Jan. 2, 2007

(54) HIGH-RESOLUTION SIGMA-DELTA CONVERTER

(75) Inventors: Mario Motz, Wernberg (AT); Lukas Doerrer, Villach (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/168,009

(22) Filed: Jun. 28, 2005

(65) Prior Publication Data

US 2006/0022855 A1 Feb. 2, 2006

(30) Foreign Application Priority Data

Jun. 28, 2004 (DE) .................. 10 2004 031 153

(51) Int. Cl.
*H03M 3/00* (2006.01)

(52) U.S. Cl. ...................... 341/143; 341/155

(58) Field of Classification Search ......... 341/143–160
See application file for complete search history.

(56) References Cited

U.S. PATENT DOCUMENTS

| | | | |
|---|---|---|---|
| 5,148,166 A * | 9/1992 | Ribner | 341/143 |
| 5,148,167 A * | 9/1992 | Ribner | 341/143 |
| 5,191,332 A * | 3/1993 | Shieu | 341/143 |
| 6,414,615 B1 * | 7/2002 | Cheng | 341/143 |
| 6,445,331 B1 * | 9/2002 | Stegers | 341/143 |
| 6,674,381 B1 * | 1/2004 | Gomez et al. | 341/143 |
| 6,930,624 B1 * | 8/2005 | Hezar et al. | 341/143 |
| 6,940,438 B1 * | 9/2005 | Koe et al. | 341/143 |

FOREIGN PATENT DOCUMENTS

| JP | 63093225 | 4/1988 |
|---|---|---|
| JP | 03117034 | 5/1991 |

OTHER PUBLICATIONS

Sansen W. et al.: Analog Circuit Design -Mixed A/D Circuit Design, Sensor Interface Circuits and Communication Circuits. In: Kluwer Academic Publishers, second printing 1996, Seiten, pp. 163-181, no month.
Modl S. et al.: 14 bit ΣΔ Modulator with Multi Bit Feedback. In: Proceedings of the 22nd European Solid-State Circuits Conference, 1996, Neuchatel, Switzerland, Seiten, pp. 224-227, no month.

* cited by examiner

*Primary Examiner*—Lam T. Mai
(74) *Attorney, Agent, or Firm*—Dicke, Billig & Czaja, PLLC

(57) ABSTRACT

A sigma-delta converter is disclosed. In one embodiment, the sigma-delta converter includes two series-connected converter stages which are each supplied with a feedback signal, a comparator stage which is connected downstream of the second converter stage, which is supplied with the output signal from the second converter stage and which provides an at least two-value comparator signal, and at least one output stage which has at least one digital integrator and which produces a multibit signal as output signal. The sigma-delta converter also has a first feedback look, which is supplied with the output signal and which has a multibit digital-analog converter which is supplied with the output signal and which converts this output signal into a first feedback signal with an amplitude that is dependent on the output signal, and a second feedback loop, which is supplied with the comparator signal, having a digital-analog converter which converts a signal that is dependent on the comparator signal into the second feedback signal.

24 Claims, 5 Drawing Sheets

HIGH-RESOLUTION SIGMA-DELTA CONVERTER

FIELD OF THE INVENTION

The present invention relates to a sigma-delta converter for converting an analog input signal into a digital output signal.

BACKGROUND

An analog-digital converter operating on the basis of the sigma-delta principle is described, by way of example, in Sansen, W.; Huijsing, J. H.; Plassche, R. J. van de: "Analog Circuit Design, Mixed A/D Circuit Design, Sensor Interface Circuits and Communication Circuits", Kluwer Academic Publishers, page 175. This converter comprises a first converter stage which is supplied with an analog input signal which is to be converted and with a first feedback signal, a second converter stage which is supplied with an output signal from the first converter stage and with a second feedback signal, and a comparator stage which is supplied with an output signal from the second converter stage. The comparator stage has an output stage connected downstream of it which has a digital integrator which produces a digital multibit signal as output signal from the converter. To feed back this multibit output signal to the first converter stage, a one-bit digital-analog converter (D/A converter) is provided which converts the multibit signal into a single-bit signal and which is operated at a higher clock frequency in comparison with the comparator stage. A further D/A converter converts the multibit output signal into the second feedback signal supplied to the second converter stage.

Mödl, S. et al. "14 bit ΣΔ modulator with multibit feedback", Proceedings of the 22nd European Solid-State Circuits Conference pp. 224–227, 1996, Neuchatel, Switzerland, describes an A/D converter having a converter stage which is supplied with an analog input signal which is to be converted and with a pulse-width-modulated feedback signal. The converter stage has a comparator stage connected downstream of it and the comparator stage has a digital integrator connected downstream of it, the integrator providing a multibit signal as output signal. To feed back the output signal to the one converter stage, there is a digital-analog converter (D/A converter) which is supplied with the multibit signal and which produces the pulse-width modulated signal. For these and other reasons there is a need for the present invention.

SUMMARY

The present invention provides a sigma-delta converter for converting an analog input signal into a digital output signal which (sigma-delta converter) is suitable for converting input signals with a wide dynamic range and a large bandwidth and which, in so doing, can be operated at a low clock frequency in order to avoid high-frequency interfering influences on the output signal produced.

In one embodiment, the inventive sigma-delta converter includes a first converter stage having a first input connection for supplying an input signal, a first feedback connection for supplying a first feedback signal, and a first output connection for providing a first output signal. A second converter stage is provided having a second input connection for supplying the first output signal, a first feedback connection for supplying a second feedback signal, and a second output connection for providing a second output signal. A comparator stage is provided which is supplied with the second output signal and which provides an at least two-value comparator signal. An output stage which is supplied with the comparator signal, which has at least one digital integrator and which produces a multibit signal as output signal. A first feedback loop is provided which is supplied with the output signal and which has a multibit digital-analog converter which converts the output signal into the first feedback signal with an amplitude that is dependent on the output signal. A second feedback loop is provided which is supplied with the comparator signal, having a digital-analog converter which converts a signal that is dependent on the comparator signal into the second feedback signal.

In one embodiment, the multibit D/A converter in the first feedback loop which converts the multibit output signal into the analog first feedback signal can be operated at the same clock frequency as that at which the digital integrator processes the comparator signal and produces the multibit output signal. High-frequency interfering influences on the output signal can therefore be avoided.

In connection with the present application, "multibit output signal" is also to be understood to mean a "multilevel output signal", that is to say an output signal which can assume a plurality of signal levels. Correspondingly, "multibit D/A converter" is also to be understood in connection with the present invention to mean a "multilevel D/A converter", that is to say a converter which is designed to convert a signal having different signal levels into an analog signal.

A fast response from the system to changes in the input signal are achieved in the case of the inventive converter by feeding back the comparator output signal to the second converter stage via the second feedback loop. The D/A converter which is present in the second converter stage may be implemented as a simple one-bit D/A converter, which means that only low implementation complexity is required.

Besides the at least one integrator, the output stage may additionally include an adder which adds an output signal from the integrator to a weighted output signal from the comparator stage and which provides the output signal. This measure contributes to increasing the stability of the system.

To improve the converter's reaction response to large changes in the input signal (wide dynamic range of the input signal) and to rapid changes in the input signal (large bandwidth of the input signal), it is also possible to provide two digital integrators connected in series in the output stage. Preferably, this involves output signals from the first and second integrators being added using an adder in order to provide the output signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
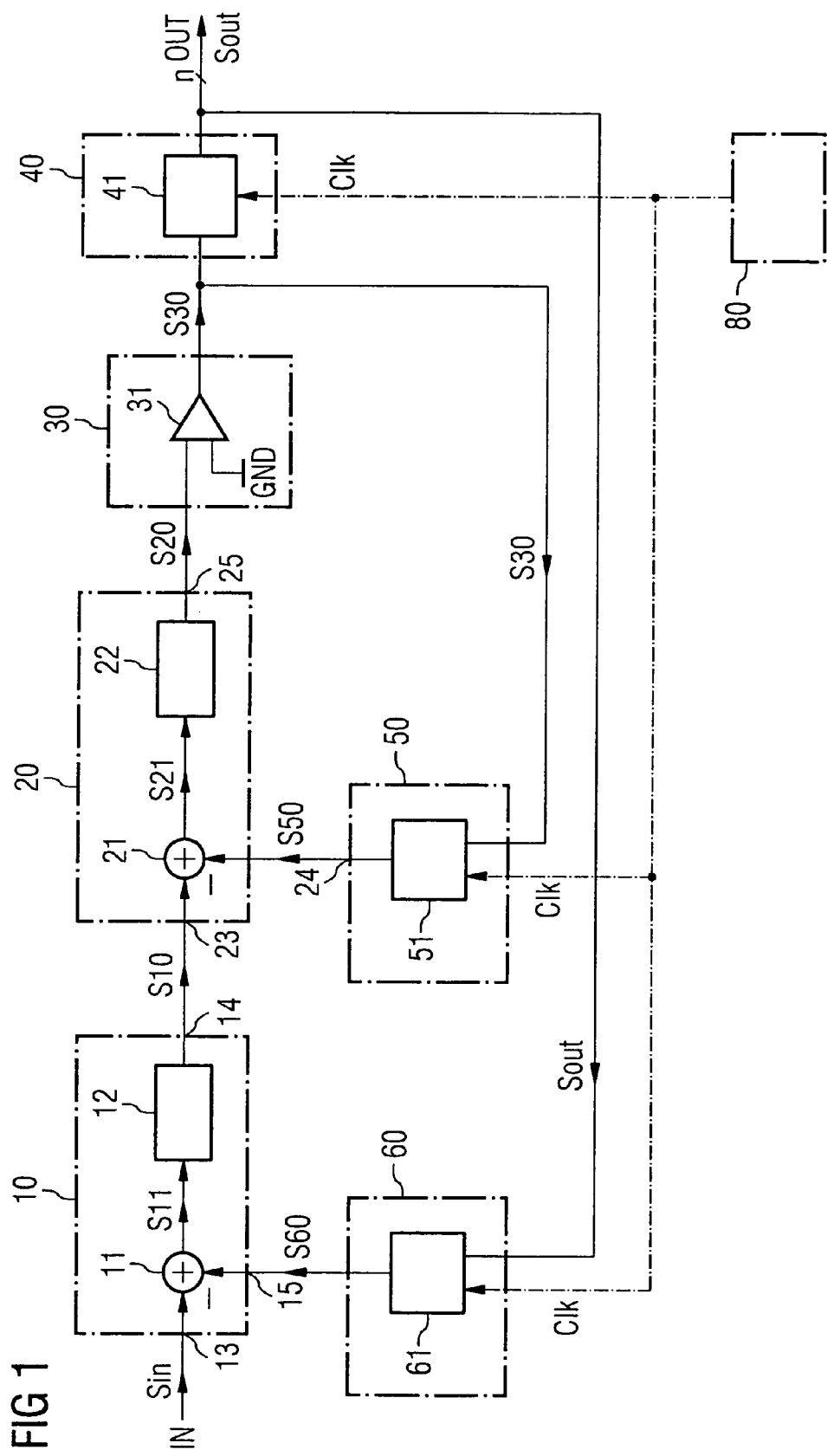
FIG. 1 illustrates a first exemplary embodiment of an inventive sigma delta converter having two converter stages, a comparator stage, an output stage and two feedback loops.

With reference to FIG. 1, the inventive sigma-delta converter (SD converter) includes an input IN for supplying an analog input signal Sin and an output OUT for providing a digital, multibit output signal Sout. The bit length of the digital data words provided at the output OUT is n in the example, with n being a positive integer greater than 1, for example n=5. The SD converter has a first converter stage 10 having a first input 13, a first output 14 and a first feedback connection 15. The first input 13 is supplied with the analog input signal Sin in this case, and the first feedback connection 15 is supplied with a first feedback signal S60 which is available at an output of a first feedback loop 60. The first output 14 provides a first output signal S10 from the first converter stage 10. In the exemplary embodiment, the first converter stage 10 comprises a subtractor 11 which is supplied with the analog input signal Sin and with the first feedback signal S60. This subtractor 11 produces a differential signal S11 which corresponds to the difference between the analog input signal Sin and the first analog feedback signal S60. This differential signal S11 is supplied to a first filter 12 which has an integrating response, for example, and which integrates the differential signal S11 in order to produce the first output signal S10.

The first converter stage 10 has a second converter stage 20 connected downstream of it which has a second input 23, a second output 25 and a second feedback connection 24. In this case, the second input 23 is supplied with the first output signal S10 from the first converter stage 10, and the second feedback connection 24 is supplied with a second feedback signal S50 which is available at the output of a second feedback loop 50. The second output of the second converter stage 20 provides a second output signal S20. The second converter stage 20 comprises a second subtractor 21 which is supplied with the first output signal S10 and with the second feedback signal S50 and which produces a differential signal S21 which corresponds to the difference between the first output signal S10 applied to the second input 23 and the second feedback signal S50. This second differential signal S21 produced by the second subtractor 21 is supplied to a second filter 22 which produces the second output signal S20. This second filter likewise has an integrating response, for example, in order to integrate the second differential signal S21 to produce the second output signal S20.

The second converter stage 20 has a comparator stage 30 connected downstream of it which is supplied with the second output signal S20 and which compares this second output signal S20 with at least one reference value in order to provide at least one comparator signal S30 at an output of the comparator stage 30. In the exemplary embodiment shown in FIG. 1, the comparator stage 30 comprises a comparator 31 whose one input is supplied with the second output signal S20 and whose other output is supplied with a reference value. By way of example, this comparator 31 is in a form such that the comparator signal S30 assumes a high level when the second output signal S20 is larger than the reference signal, and assumes a low level when the second output signal S20 is smaller than the reference signal. The reference value used in the exemplary embodiment shown in FIG. 1 is a reference-ground potential GND, which corresponds to the reference-ground potential taken as a reference by all of the signals in the SD converter. A comparison between the second output signal S20 and this reference-ground potential GND corresponds to a comparison between this signal and a value zero.

The comparator stage 30 has an output stage 40 connected downstream of it which provides the output signal Sout from the comparator signal S30 produced by the comparator stage 30. This output stage 40 has a digital integrator which integrates the comparator signal S30 in order to produce the multibit output signal Sout. This digital integrator 41 comprises a digital counter, for example, which is incremented or decremented in time with a clock signal on the basis of the comparator signal S30 and which provides the respective counter reading as a multibit output signal in time with this clock signal. This internal counter (not illustrated in more detail) in the digital integrator 41 is respectively incremented, for example, when the comparator signal S30 has a high level at the time of a clock pulse of the clock signal, and the internal counter is correspondingly decremented when the comparator signal S30 has a low level at the time of the clock pulse. The internal counter is preferably incremented and decremented in respective steps of one, but it is also possible for larger counting steps to be implemented.

The clock signal, whose clock is taken by the digital integrator 41 as a basis for evaluating the comparator signal S30 in order to increment and decrement the internal counter and whose clock is taken as a basis for producing the output signal, is produced by an external clock generator 80, for example, which provides a clock signal CLK which is supplied to a clock input of the digital integrator 41.

An input of the first feedback loop 60, whose output is connected to the first feedback connection 15 of the first converter stage 10, is connected to the output OUT of the SD converter. This first feedback loop 60 has a multibit digital-analog converter (multibit D/A converter) which produces the analog first feedback signal S60 from the digital multibit output signal Sout. Such D/A converters are sufficiently well known, so that a more detailed explanation can be dispensed with here.

An input of the second feedback loop 50, whose output is connected to the second feedback connection 24 of the second converter stage 20, is connected to the output of the comparator stage 30. This second converter stage 50 comprises a second D/A converter which converts the comparator signal S30 into the analog second feedback signal S50. The resolution of this second D/A converter 50 is dependent on the resolution of the comparator signal S30, in particular. In the case of a two-value comparator signal S30, the second D/A converter 50 is designed to produce a two-value output signal S50 which provides a positive first value for a high level of the comparator signal S30 and provides a second negative value for a low level of the comparator signal S30, for example. The amplitudes of the first and second values are preferably the same in this case.

The second feedback loop 50, which is used to feed back the comparator signal S30 to the second converter stage 20 via the second D/A converter, produces rapid negative feedback and hence a fast reaction from the SD converter to changes in the input signal Sin.

In the inventive SD converter, the output stage 40 and also the first D/A converter 60 and the second D/A converter 50 are each operated at the same clock frequency, for example at the clock frequency of the clock signal CLK provided by the clock generator 50. In this case, the first D/A converter 60 changes the amplitude of the analog feedback signal S60 in time with this clock signal CLK on the basis of the respective value of the multibit output signal Sout, and the second D/A converter 50 produces one of the two possible amplitudes in time with this clock signal CLK on the basis of the respective value of the comparator signal S30 which is fed back.

The inventive SD converter requires just a single comparator in total if a two-value comparator signal S30 is sufficient for the desired resolution.

Figure 5:
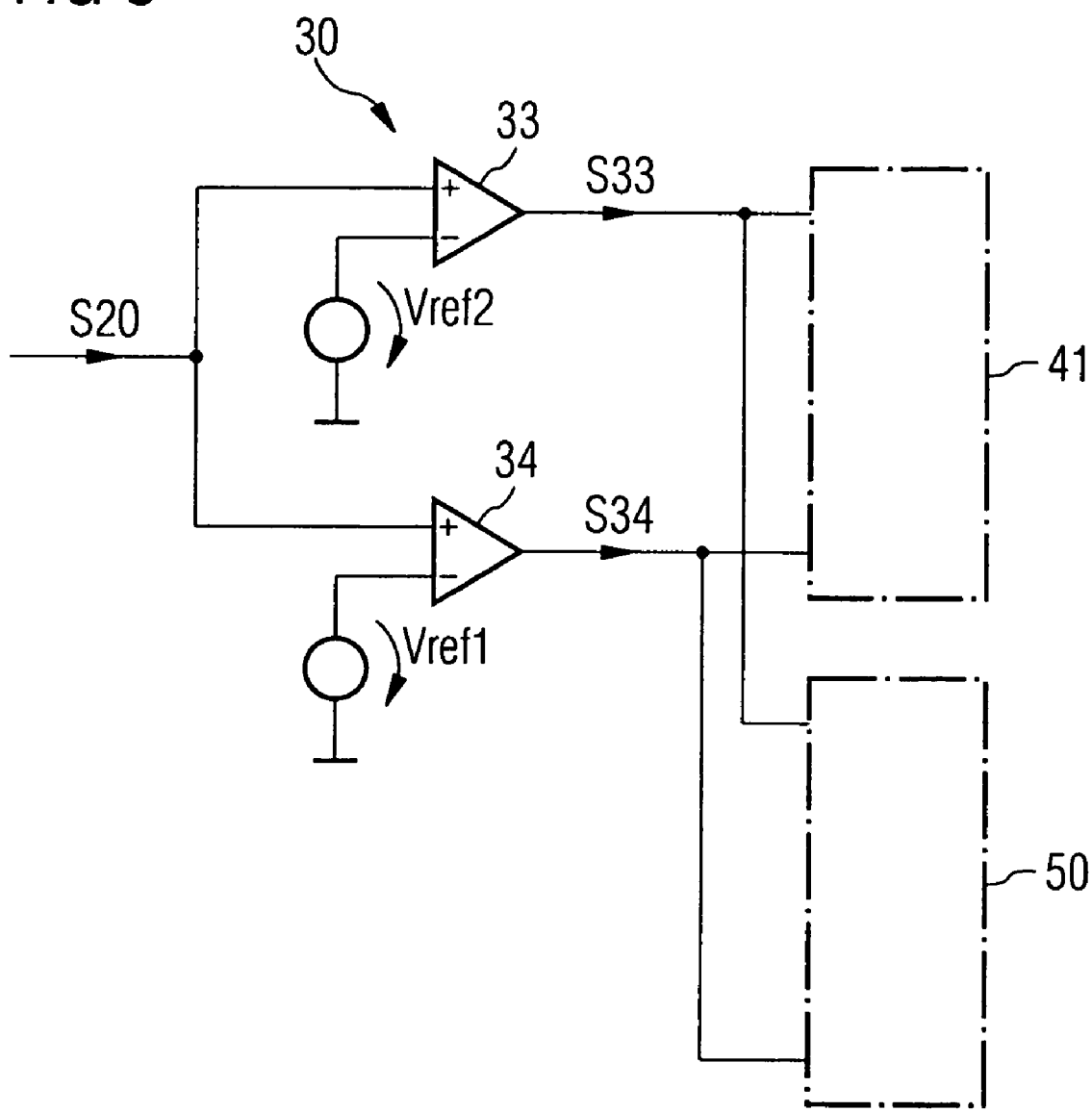
FIG. 5 illustrates an example of a comparator stage.

An improved reaction response from the SD converter to changes in the input signal are able to be achieved if the comparator stage produces a comparator signal S30 in which more than two comparison states can be distinguished. An exemplary embodiment of such a comparator stage is shown in FIG. 5. This comparator stage comprises two comparators 33, 34 which compare the second output signal S20 applied to the input of the comparator stage with an upper threshold value Vref2 and a lower threshold value Vref1. In this case, the first comparator 33 compares the second output signal S20 with the upper threshold value Vref2 and provides at its output a first comparator signal S33 which assumes a high level when the second output signal S20 is larger than the upper threshold value Vref2. The second comparator 34 compares the second output signal S20 with the lower threshold value Vref1 and provides a second comparator signal S34 which, in the example, assumes a high level when the second output signal S20 is smaller than the lower threshold value Vref1.

The first and second comparator signals S33, S34 can now be used to distinguish three different levels of the second output signal S20, namely
a) a level which is higher than the upper threshold value Vref2, which is indicated by the first comparator signal S33 being at a high level.
b) a level for the second output signal which is between the upper and lower threshold values Vref2, Vref1, which is indicated by the first comparator signal S33 being at a low level and the second comparator signal S34 being at a high level.
c) a level for the second output signal S20 which is below the lower threshold value Vref1, which is indicated by the second comparator signal S34 being at a low level.

In this exemplary embodiment, the digital integrator 41 connected downstream of this comparator arrangement 30 is designed to increment or decrement its internal counter on the basis of the three-value comparator output signal which is formed by the two comparator signals S33, S34. By way of example, the integrator can be designed to increment its counter reading when the second output signal S20 is larger than the upper threshold value Vref2, to decrement the counter reading when the second output signal S20 is smaller than the lower threshold value Vref1, and to leave the counter reading unchanged when the second output signal S20 is between the upper and lower threshold values Vref2, Vref1.

When using a comparator as shown in FIG. 5, the second D/A converter is preferably designed to provide a three-value second feedback signal S50, this feedback signal having a positive first value, for example, when the output signal from the comparator device indicates that the second output signal S20 is above the upper threshold Vref2, providing a negative second signal value when the second output signal S20 is below the lower threshold Vref1, and providing a feedback signal S50 having a value zero when the second output signal S20 is between the upper and lower thresholds Vref1, Vref2.

It should be pointed out that the analog integrators 12, 22 in the first and second converter stages can naturally be replaced by any filters having suitable transfer functions, which are sufficiently well known to a person skilled in the art. It goes without saying that it is also possible for one of the two converter stages 10, 20 or both converter stages to contain (not shown in more detail) at least one further analog integrator which is connected downstream of the integrator 12, 22 shown in the figure and which provides the output signal from the respective converter stage.

Figure 2:
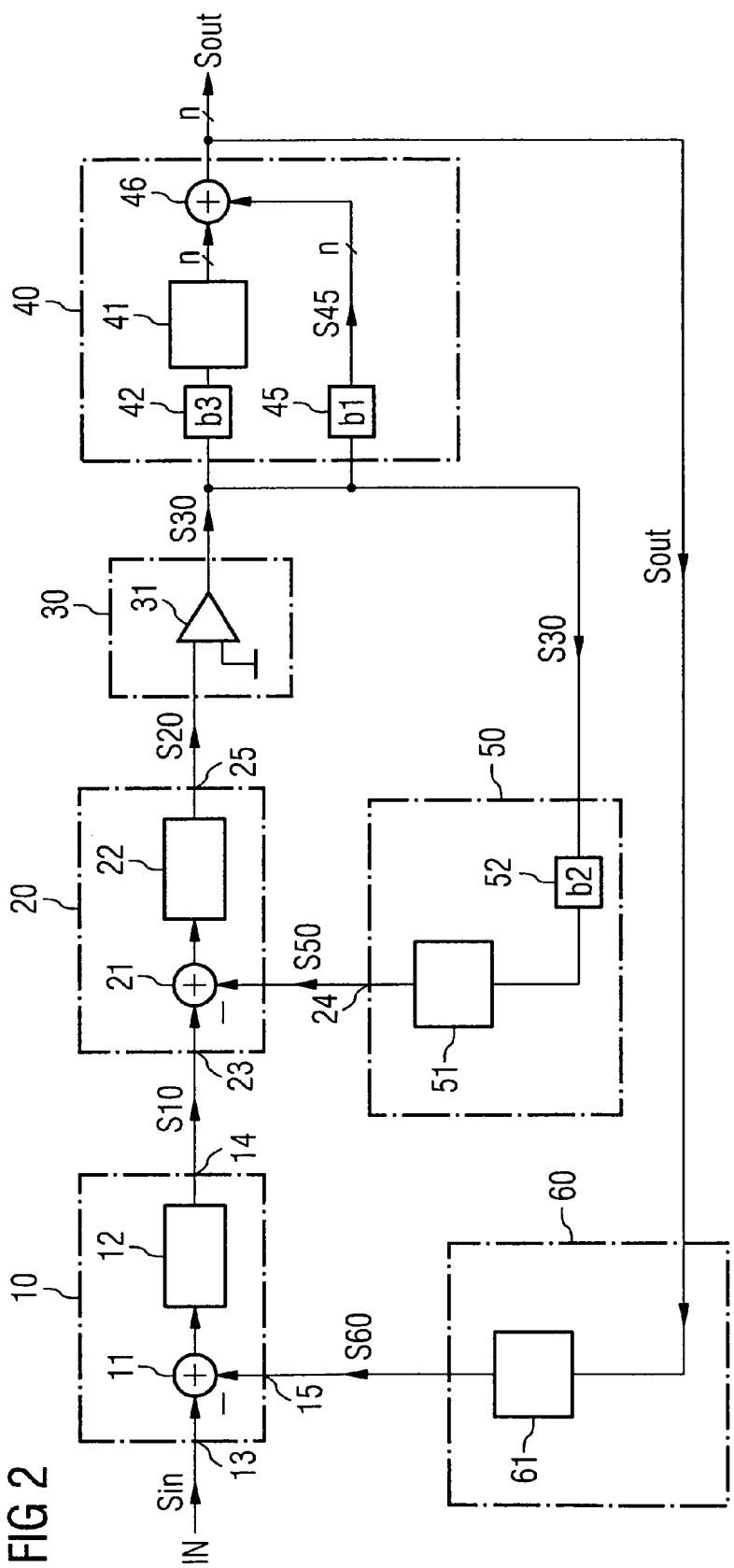
FIG. 2 illustrates a second exemplary embodiment of the sigma-delta converter.

FIG. 2 illustrates a modification of the SD converter shown in FIG. 1.

In the case of this SD converter, the output stage 40 comprises an adder 46 which is firstly supplied with an output signal from the digital integrator 41 and which is secondly supplied with the output signal S30 from the comparator device 30, weighted using a first weighting factor b1. An output of this adder 46 provides the multibit output signal Sout. Like the digital integrator 41, the adder 46 is actuated in clocked fashion (not illustrated in more detail) in order to add the weighted comparator signal S45 to the output signal from the digital integrator 41 in time with a clock signal. The output stage 40 also comprises a further weighting unit 42 which is connected upstream of the digital integrator 41 and which weights the comparator signal S30 using a weighting factor b3.

The weighting unit 42 is designed to provide the signal S30 as a multibit signal Sout having a number of bit positions which corresponds to the number of bit positions in the multibit digital-analog converter 61.

The stability of the A/D converter is assured by the weighting unit 42, since this signal path acts on the D/A converter 51, 61 directly and without the diversion through the digital integrator. Robust dimensioning using very simple circuitry is provided if the weighting factors are chosen such that: b1=2·b3.

In the exemplary embodiment, the second feedback loop 50 comprises a second weighting unit 52 which is connected upstream of the second D/A converter and which weights the comparator signal S30 using a second weighting factor b2. By way of example, the weighting factors are as follows: b1=2; b2=2; and b3=1.

In the exemplary embodiment illustrated in FIG. 2, the comparator output signal S30 may naturally also be a comparator signal which can assume three or more signal states, with the weighting units 42, 45, 52 being suited to this end as appropriate.

Figure 3:
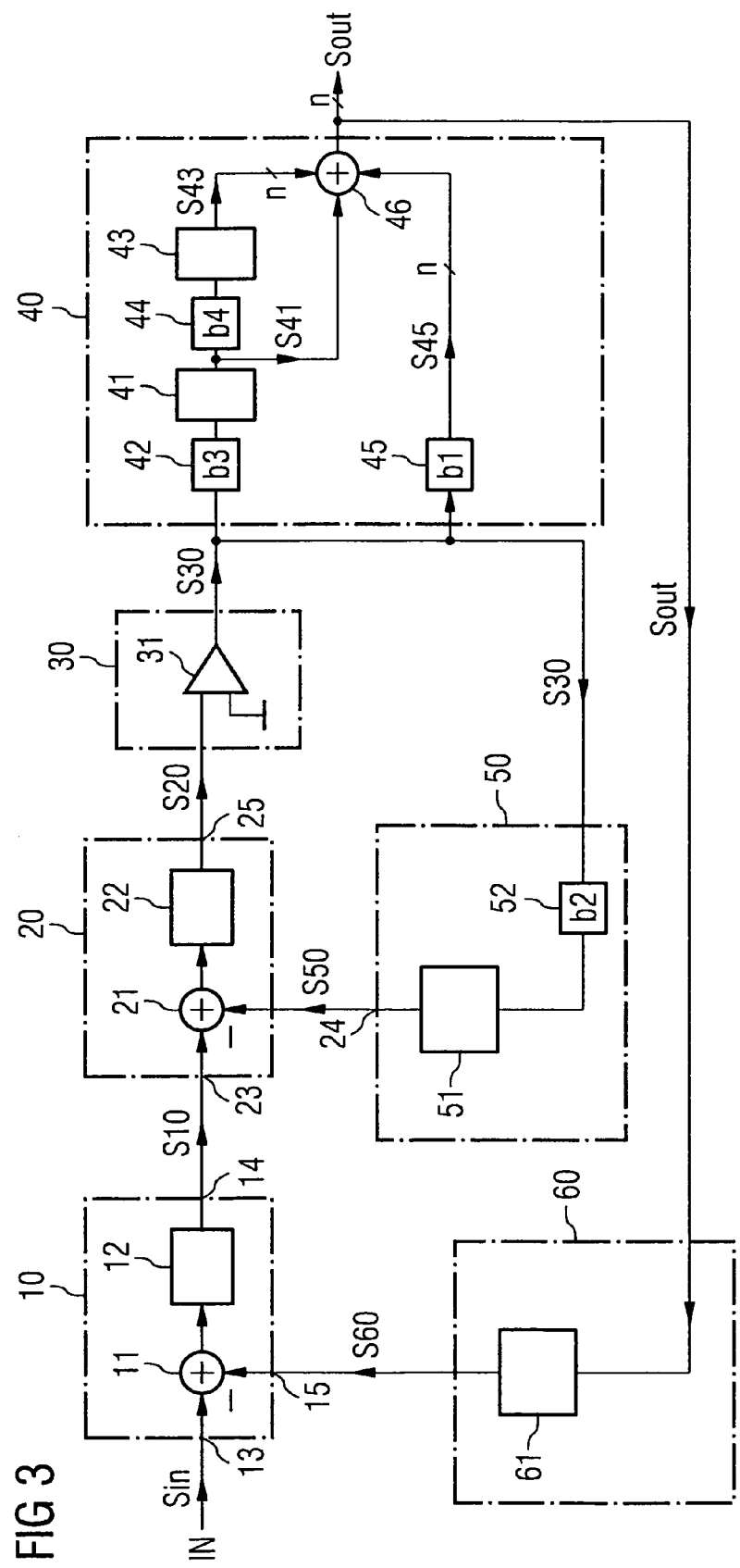
FIG. 3 illustrates a third exemplary embodiment of the sigma-delta converter.

A modification of the SD converter illustrated in FIG. 2 is illustrated in FIG. 3. In the case of this SD converter, the output stage 40 comprises two digital integrators 41, 43, namely the digital integrator 41 already explained above and a second digital integrator 43 connected downstream of this first digital integrator. An output signal from the second digital integrator S43 is supplied to the adder 46 together with the weighted comparator signal S45. The output of this adder 46 provides the multibit output signal Sout. The adder 46 in the output stage 40 is supplied not only with the output signal S43 from the second digital integrator 43 but also with an output signal from the first digital integrator 41. In this exemplary embodiment, the output signal Sout from the SD converter thus contains a component which results from the comparator signal S30, a component which arises through single integration of the comparator output signal S30, and a further component which arises through double integration of the comparator output signal S30. The first and second integrators 41, 43 have a further weighting unit 44 connected between them which weights the output signal S41 from the first integrator 41 using a further weighting factor b4.

In the case of this SD converter, the output signal S43 from the second integrator 43 essentially follows the input signal Sin. The input of this second integrator 43, and hence the output of the first integrator 41, thus have a signal applied to them which is based on the derivation of the input signal Sin.

The advantage of using the two integrators 41, 43 is the higher resolution of the A/D converter at a given sampling frequency and at a given signal bandwidth, because the number of integrators used increases the order of the sigmadelta converter and the associated noise shaping effect.

A further advantage of the arrangement described here is that the feedback via the second integrator 43 can very easily be dispensed with by using a one-bit D/A converter 51 or a three-level D/A converter 51, while a signal having a plurality of bits can be provided for the feedback of the first integrator, which allows the dynamic range to be increased.

Figure 4:
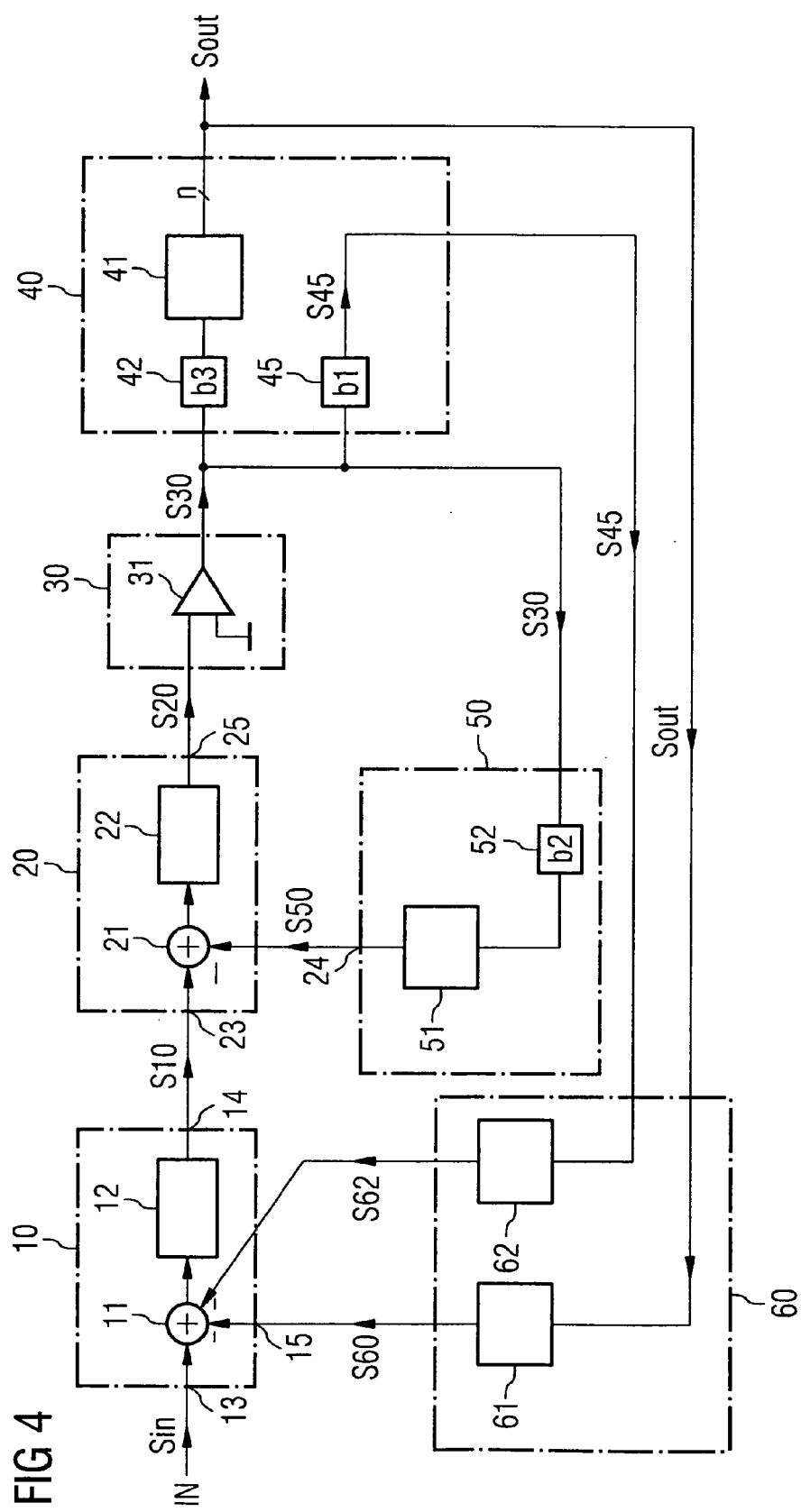
FIG. 4 illustrates a fourth exemplary embodiment of the sigma-delta converter.

A further exemplary embodiment of the inventive SD converter is shown in figure 4. The exemplary embodiment shown in FIG. 4 is based on that shown in FIG. 2, there being no addition of the output signal S41 from the digital integrator 41 in the output stage 40 to the weighted comparator output signal S45. Instead, the weighted comparator output signal S45 is supplied to a second D/A converter in the first feedback loop 60, which second D/A converter takes the weighted comparator signal S45 and produces a further analog feedback signal S62. This further analog feedback signal S62 is subtracted from the input signal Sin together with the first analog feedback signal S60 in the first subtractor 11 in the first converter stage 10. The design and manner of operation of this second D/A converter in the first feedback loop 60 are based on the design and manner of operation of the D/A converter 51 in the second feedback loop 50, for example.

The invention claimed is:

1. A sigma-delta converter comprising:
   a first converter stage for supplying an input signal, a first feedback signal, and a first output signal;
   a second converter stage for supplying the first output signal, a second feedback signal, a second output signal;
   a comparator stage which provides an at least two-value comparator signal;
   an output stage which has at least one digital integrator and which produces a multibit signal as an output signal;
   a first feedback loop which is supplied with the output signal and which has a multibit digital-analog converter which is supplied with the output signal and which converts the output signal into the first feedback signal with an amplitude that is dependent on the output signal; and
   a second feedback loop which is supplied with the comparator signal, having a digital-analog converter which converts a signal that is dependent on the comparator signal into the second feedback signal.

2. The sigma-delta converter of claim 1, comprising wherein the first converter stage has a subtracter, which subtracts the first feedback signal from the input signal, and an integrator, which is connected downstream of the subtractor and which provides the first output signal.

3. The sigma-delta converter of claim 1, comprising wherein the second converter stage has a subtracter, which subtracts the second feedback signal from the first output signal, and an integrator, which is connected downstream of the subtractor and which provides the second output signal.

4. The sigma-delta converter of claim 1, comprising wherein the second feedback loop has a second weighting unit which is connected upstream of the digital-analog converter.

5. The sigma-delta converter of claim 1, comprising wherein at least one of the first and second converter stages have an integrator and at least one further integrator connected downstream of this integrator.

6. A sigma-delta converter comprising:
   a first converter stage for supplying an input signal, a first feedback signal, and a first output signal;
   a second converter stage for supplying the first output signal, a second feedback signal, a second output signal;
   a comparator stage which provides an at least two-value comparator signal;
   an output stage which has at least one digital interator and which produces a multibit signal as an output signal;
   a first feedback loop which is supplied with the output signal and which has a multibit digital-analog converter which is supplied with the output signal and which converts the output signal into the first feedback signal with an amplitude that is dependent on the output signal; and
   a second feedback loop which is supplied with the comparator signal, having a digital-analog converter which converts a signal that is dependent on the comparator signal into the second feedback signal,
   wherein the output stage has an adder having a first and a second input the first input being supplied with an output signal from the at least one digital integrator and the second input being supplied with a signal that is proportional to the comparator output signal, and which provides the output signal.

7. The sigma-delta converter of claim 6, comprising wherein the at least one digital integrator has a first weighting unit connected upstream of it and in which the second input of the adder has a second weighting unit connected upstream of it.

8. A sigma-delta converter comprising:
   a first converter stage for supplying an input signal, a first feedback signal, and a first output signal;
   a second converter stage for supplying the first output signal, a second feedback signal, a second output signal;
   a comparator stage which provides an at least two-value comparator signal;
   an output stage which has at least one digital integrator and which produces a multibit signal as an output signal;
   a first feedback loop which is supplied with the output signal and which has a multibit digital-analog converter which is supplied with the output signal and which converts the output signal into the first feedback signal with an amplitude that is dependent on the output signal; and
   a second feedback loop which is supplied with the comparator signal, having a digital-analog converter which converts a signal that is dependent on the comparator signal into the second feedback signal,
   wherein the output stage has a first digital integrator and a second digital integrator which are connected in series, the output signal being dependent on a signal which is present at the output of the second integrator.

9. The sigma-delta converter of claim 8, comprising wherein has an adder having at least one first and a second input, the first input being supplied with an output signal from the second integrator and the second input being supplied with a signal that is dependent on the comparator output signal, and which provides the output signal.

10. The sigma-delta converter of claim 9, comprising wherein the first integrator has a first weighting unit connected upstream of it, the second input of the adder has a second weighting unit connected upstream of it, and in which the second integrator has a third weighting unit connected upstream of it.

11. The sigma-delta convener of claim 9, comprising wherein the adder has a third input which is supplied with an output signal from the first digital integrator.

12. A sigma-delta converter of comprising:
a first converter stage for supplying an input signal, a first feedback signal, and a first output signal;
a second converter stage for supplying the first output signal, a second feedback signal, a second output signal;
a comparator stage which provides an at least two-value comparator signal;
an output stage which has at least one digital integrator and which produces a multibit signal as an output signal;
a first feedback loop which is supplied with the output signal and which has a multibit digital-analog converter which is supplied with the output signal and which converts the output signal into the first feedback signal with an amplitude that is dependent on the output signal; and
a second feedback loop which is supplied with the comparator signal, having a digital-analog converter which converts a signal that is dependent on the comparator signal into the second feedback signal,
wherein the second feedback loop has a second D/A converter which is supplied with a signal that is dependent on the comparator signal and which provides a further feedback signal which is supplied to the first converter stage.

13. A sigma-delta converter comprising:
a first converter stage having a first input connection for supplying an input signal, a first feedback connection for supplying a first feedback signal, and a first output connection for providing a first output signal;
a second converter stage having a second input connection for supplying the first output signal, a first feedback connection for supplying a second feedback signal, and a second output connection for providing a second output signal;
a comparator stage which is supplied with the second output signal and which provides an at least two-value comparator signal;
an output stage which has at least one digital integrator and which produces a multibit signal as output signal;
a first feedback loop which is supplied with the output signal and which has a multibit digital-analog converter which is supplied with the output signal and which converts this output signal into the first feedback signal with an amplitude that is dependent on the output signal; and
a second feedback loop which is supplied with the comparator signal, having a digital-analog converter which converts a signal that is dependent on the comparator signal into the second feedback signal.

14. The sigma-delta converter of claim 13, comprising wherein the first converter stage has a subtractor, which subtracts the first feedback signal from the input signal, and an integrator, which is connected downstream of the subtracter and which provides the first output signal.

15. The sigma-delta converter of claim 13, comprising wherein the second converter stage has a subtractor, which subtracts the second feedback signal from the first output signal, and an integrator, which is connected downstream of the subtracter and which provides the second output signal.

16. A sigma-delta converter comprising:
a first converter stage having a first input connection for supplying an input signal, a first feedback connection for supplying a first feedback signal, and a first output connection for providing a first output signal;
a second converter stage having a second input connection for supplying the first output signal, a first feedback connection for supplying a second feedback signal, and a second output connection for providing a second output signal;
a comparator stage which is supplied with the second output signal and which provides an at least two-value comparator signal;
an output stage which has at least one digital integrator and which produces a multibit signal as output signal;
a first feedback loop which is supplied with the output signal and which has a multibit digital-analog converter which is supplied with the output signal and which converts this output signal into the first feedback signal with an amplitude that is dependent on the output signal; and
a second feedback loop which is supplied with the comparator signal, having a digital-analog converter which converts a signal that is dependent on the comparator signal into the second feedback signal,
wherein the output stage has an adder having a first and a second input, the first input being supplied with an output signal from the at least one digital integrator and the second input being supplied with a signal that is proportional to the comparator output signal, and which provides the output signal.

17. The sigma-delta converter of claim 16, comprising wherein the at least one digital integrator has a first weighting unit connected upstream of it and in which the second input of the adder has a second weighting unit connected upstream of it.

18. The sigma-delta converter of claim 17, comprising wherein the second feedback loop has a second weighting unit which is connected upstream of the digital-analog converter.

19. The sigma-delta convener of claim 18, comprising wherein the output stage has a first digital integrator and a second digital integrator which are connected in series, the output signal being dependent on a signal which is present at the output of the second integrator.

20. The sigma-delta convener of claim 19, comprising an adder having at least one first and a second input, the first input being supplied with an output signal from the second integrator and the second input being supplied with a signal that is dependent on the comparator output signal, and which provides the output signal.

21. The sigma-delta converter of claim 20, comprising wherein the first integrator has a first weighting unit connected upstream of it, the second input of the adder has a second weighting unit connected upstream of it, and in which the second integrator has a third weighting unit connected upstream of it.

22. The sigma-delta converter as claimed in claim 20, comprising wherein the adder has a third input which is supplied with an output signal from the first digital integrator.

23. The sigma-delta converter of claim 22, comprising wherein the second feedback loop has a second D/A converter which is supplied with a signal that is dependent on the comparator signal and which provides a further feedback signal which is supplied to the first converter stage.

24. The sigma-delta converter of claim 23, comprising wherein at least one of the first and second converter stages have an integrator and at least one further integrator connected downstream of this integrator.

* * * * *